United States Patent
Sung et al.

(10) Patent No.: US 9,496,418 B2
(45) Date of Patent: Nov. 15, 2016

(54) NON-VOLATILE MEMORY AND FABRICATING METHOD THEREOF

(71) Applicant: Powerchip Technology Corporation, Hsinchu (TW)

(72) Inventors: Da Sung, Hsinchu County (TW); Cheng-Yuan Hsu, Hsinchu (TW); Jian-Ming Jaw, New Taipei (TW); Hui-Huang Chen, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/703,897

(22) Filed: May 5, 2015

(65) Prior Publication Data

US 2016/0240686 A1  Aug. 18, 2016

(30) Foreign Application Priority Data

Feb. 17, 2015  (TW) .............................. 104105639 A

(51) Int. Cl.

| | |
|---|---|
| *H01L 29/788* | (2006.01) |
| *H01L 27/115* | (2006.01) |
| *H01L 29/66* | (2006.01) |
| *H01L 29/12* | (2006.01) |
| *H01L 21/28* | (2006.01) |
| *H01L 21/306* | (2006.01) |
| *H01L 21/308* | (2006.01) |

(52) U.S. Cl.
CPC ..... *H01L 29/7884* (2013.01); *H01L 21/28273* (2013.01); *H01L 21/3081* (2013.01); *H01L 21/30625* (2013.01); *H01L 27/11521* (2013.01); *H01L 29/125* (2013.01); *H01L 29/66553* (2013.01); *H01L 29/66825* (2013.01)

(58) Field of Classification Search
CPC .................................................. H01L 29/7884
See application file for complete search history.

(56) References Cited

U.S. PATENT DOCUMENTS

| | | | |
|---|---|---|---|
| 6,388,293 B1 | 5/2002 | Ogura et al. | |
| 6,678,190 B2 | 1/2004 | Yang et al. | |
| 7,230,305 B2* | 6/2007 | Min .................. | H01L 27/105 257/390 |
| 2002/0064910 A1* | 5/2002 | Chen .................. | H01L 27/115 438/201 |
| 2007/0170494 A1* | 7/2007 | Park .................. | H01L 27/115 257/316 |
| 2007/0207575 A1* | 9/2007 | Taniguchi ......... | H01L 21/82346 438/199 |

* cited by examiner

*Primary Examiner* — Michael Lebentritt
*Assistant Examiner* — Jordan Klein
(74) *Attorney, Agent, or Firm* — Jianq Chyun IP Office

(57) ABSTRACT

A non-volatile memory including the following elements is provided. A first conductive layer and a second conductive layer are disposed on a substrate and separated from each other. A patterned hard mask layer is disposed on the first conductive layer and exposes a sharp tip of the first conductive layer. A third conductive layer is disposed on the substrate at one side of the first conductive layer away from the second conductive layer. The third conductive layer is located on a portion of the first conductive layer and covers the sharp tip, and the third conductive layer and the first conductive layer are isolated from each other. A first doped region is disposed in the substrate below the third conductive layer. A second doped region is disposed in the substrate at one side of the second conductive layer away from the first conductive layer.

10 Claims, 3 Drawing Sheets

NON-VOLATILE MEMORY AND FABRICATING METHOD THEREOF

CROSS-REFERENCE TO RELATED APPLICATION

This application claims the priority benefit of Taiwan application serial no. 104105639, filed on Feb. 17, 2015. The entirety of the above-mentioned patent application is hereby incorporated by reference herein and made a part of this specification.

BACKGROUND OF THE INVENTION

1. Field of the Invention

The invention relates to a memory and a fabricating method thereof, and more particularly, to a non-volatile memory and a fabricating method thereof.

2. Description of Related Art

Since a non-volatile memory device has the advantage of retaining stored data even in a power-off situation, the non-volatile memory device has become a widely adopted memory device in personal computers and electronic equipment.

Many non-volatile memories adopt a split gate design. A non-volatile memory structure having a split gate includes a floating gate and a select gate located at one side of the floating gate.

However, the non-volatile memory having a floating gate and a select gate needs a higher voltage and a greater overlapping region of the drain and the floating gate to perform a programming operation and an erasing operation, and therefore the size of memory cells cannot be further reduced.

SUMMARY OF THE INVENTION

The invention provides a non-volatile memory and a fabricating method thereof capable of further reducing the size of memory cells.

The invention provides a non-volatile memory including a substrate, a first conductive layer, a second conductive layer, a patterned hard mask layer, a third conductive layer, a first doped region, and a second doped region. The first conductive layer and the second conductive layer are disposed on the substrate and separated from each other. The patterned hard mask layer is disposed on the first conductive layer and exposes a sharp tip of the first conductive layer. The third conductive layer is disposed on the substrate at one side of the first conductive layer away from the second conductive layer. The third conductive layer is located on a portion of the first conductive layer and covers the sharp tip, and the third conductive layer and the first conductive layer are isolated from each other. The first doped region is disposed in the substrate below the third conductive layer. The second doped region is disposed in the substrate at one side of the second conductive layer away from the first conductive layer.

According to an embodiment of the invention, in the non-volatile memory, the first conductive layer and the second conductive layer are, for instance, derived from the same conductive material layer, and the first conductive layer and the third conductive layer are, for instance, derived from different conductive material layers.

According to an embodiment of the invention, in the non-volatile memory, the patterned hard mask layer is, for instance, a single layer structure or a multilayer structure.

According to an embodiment of the invention, in the non-volatile memory, a first dielectric layer is further included. The first dielectric layer is disposed between the first conductive layer and the substrate and between the second conductive layer and the substrate.

According to an embodiment of the invention, in the non-volatile memory, a second dielectric layer is further included. The second dielectric layer is disposed between the first conductive layer and the second conductive layer.

According to an embodiment of the invention, in the non-volatile memory, a third dielectric layer is further included. The third dielectric layer is disposed between the third conductive layer and the first conductive layer and between the third conductive layer and the substrate.

According to an embodiment of the invention, in the non-volatile memory, a third doped region is further included. The third doped region is disposed in the substrate between the first conductive layer and the second conductive layer.

According to an embodiment of the invention, in the non-volatile memory, the programming method of the non-volatile memory is, for instance, a source side injection (SSI) method or a hot electron injection (HEI) method.

According to an embodiment of the invention, in the non-volatile memory, the erasing method of the non-volatile memory is, for instance, performing erasing between the first conductive layer and the third conductive layer via a Fowler-Nordheim (FN) tunneling method.

The invention provides a fabricating method of a non-volatile memory. The fabricating method includes the following steps. A first conductive layer and a second conductive layer separated from each other are formed on a substrate. A patterned hard mask layer is formed on the first conductive layer and the second conductive layer, and the patterned hard mask layer exposes a sharp tip of the first conductive layer. A first doped region is formed in the substrate at one side of the first conductive layer away from the second conductive layer. A second doped region is formed in the substrate at one side of the second conductive layer away from the first conductive layer. A third conductive layer is formed at one side of the first conductive layer away from the second conductive layer. The third conductive layer is located on a portion of the first conductive layer and covers the sharp tip, and the third conductive layer and the first conductive layer are isolated from each other.

According to an embodiment of the invention, the fabricating method of a non-volatile memory further includes forming a first dielectric layer between the first conductive layer and the substrate and between the second conductive layer and the substrate.

According to an embodiment of the invention, in the fabricating method of a non-volatile memory, the forming method of the first conductive layer and the second conductive layer includes the following steps. A conductive material layer is formed on a substrate. The patterned hard mask layer is formed on the conductive material layer. A spacer is formed at two sides of the patterned hard mask layer. A portion of the conductive material layer is removed by using the patterned hard mask layer and the spacer as a mask.

According to an embodiment of the invention, in the fabricating method of a non-volatile memory, the spacer is further removed to expose the sharp tip of the first conductive layer.

According to an embodiment of the invention, in the fabricating method of a non-volatile memory, the forming method of the first doped region is, for instance, an ion implantation method.

According to an embodiment of the invention, in the fabricating method of a non-volatile memory, the forming method of the second doped region is, for instance, an ion implantation method.

According to an embodiment of the invention, the fabricating method of a non-volatile memory further includes forming a third doped region in the substrate between the first conductive layer and the second conductive layer.

According to an embodiment of the invention, in the fabricating method of a non-volatile memory, the forming method of the third conductive layer includes the following steps. A second dielectric layer is formed on the substrate. The second dielectric layer covers the first conductive layer, the second conductive layer, and the patterned hard mask layer. A portion of the second dielectric layer is removed to form an opening in the second dielectric layer. The opening exposes the sharp tip of the first conductive layer, the sidewall of the first conductive layer adjacent to the first doped region, and the substrate located at one side of the first conductive layer away from the second conductive layer. A third dielectric layer is formed on the first conductive layer and on the substrate exposed by the opening. A conductive material layer filling the opening is formed on the third dielectric layer. A portion of the conductive material layer is removed.

According to an embodiment of the invention, in the fabricating method of a non-volatile memory, a planarization process is further performed on the second dielectric layer before the opening is formed.

According to an embodiment of the invention, in the fabricating method of a non-volatile memory, the forming step of the opening further includes removing a portion of the patterned hard mask layer located on the first conductive layer and adjacent to the first doped region.

According to an embodiment of the invention, in the fabricating method of a non-volatile memory, the removal method of a portion of the conductive material layer includes, for instance, performing a patterning process or a chemical mechanical polishing process on the conductive material layer.

Based on the above, in the non-volatile memory and the fabricating method thereof provided in the invention, since the third conductive layer is located on a portion of the first conductive layer and covers the sharp tip, the voltage needed for a programming operation and an erasing operation can be effectively reduced and the overlapping region of the first doped region and the first conductive layer can be effectively reduced. As a result, the size of memory cells can be further reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views of the fabricating process of a non-volatile memory of an embodiment of the invention. FIG. 1F is a cross-sectional view of a non-volatile memory of another embodiment of the invention.

Figure 1A:
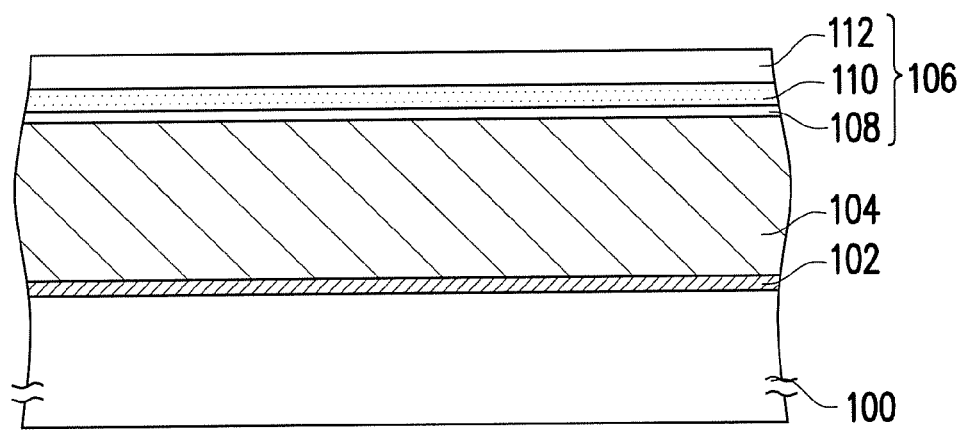
FIG. 1A to FIG. 1E are cross-sectional views of the fabricating process of a non-volatile memory of an embodiment of the invention.

Referring to FIG. 1A, a dielectric layer 102 can be formed on a substrate 100. The dielectric layer 102 can be used as a gate dielectric layer or a tunneling dielectric layer. The material of the dielectric layer 102 is, for instance, silicon oxide. The framing method of the dielectric layer 102 is, for instance, a the oxidation method or a chemical vapor deposition method.

A conductive material layer 104 is formed on the dielectric layer 102. The material of the conductive material layer 104 is, for instance, doped polysilicon. The forming method of the conductive material layer 104 is, for instance, a chemical vapor deposition method.

A hard mask layer 106 is formed on the conductive material layer 104. The hard mask layer 106 can be a single layer structure or a multilayer structure such as a single layer structure of silicon oxide layer or a multilayer structure of silicon oxide layer/silicon nitride layer/silicon oxide layer. In the present embodiment, the hard mask layer 106 is exemplified by including a multilayer structure of a silicon oxide layer 108, a silicon nitride layer 110, and a silicon oxide layer 112. The forming method of the hard mask layer 106 is, for instance, a chemical vapor deposition method.

Figure 1B:
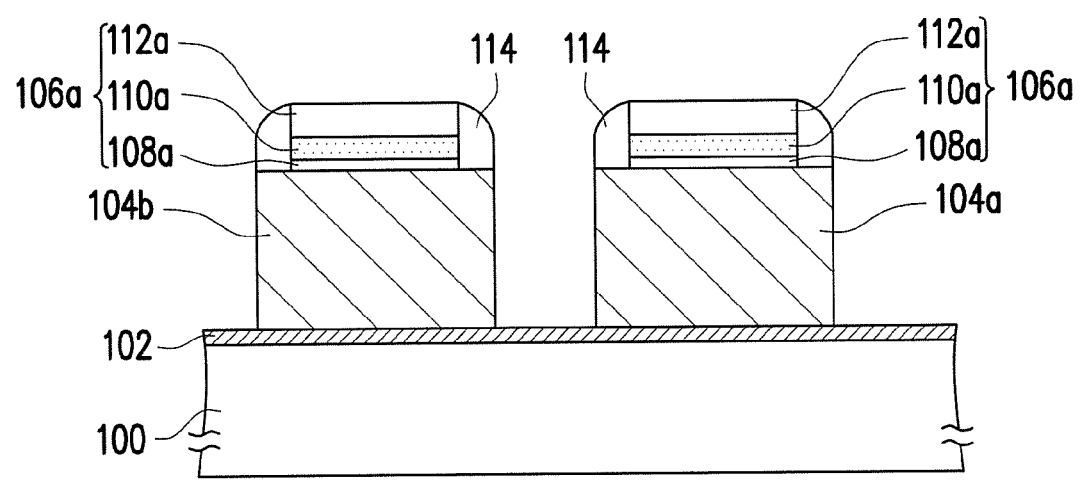

Referring to FIG. 1B, a patterning process is performed on the hard mask layer 106 to form a patterned hard mask layer 106a on the conductive material layer 104, wherein the patterned hard mask layer 106a includes a silicon oxide layer 108a, a silicon nitride layer 110a, and a silicon oxide layer 112a. The patterned hard mask layer 106a can be formed via, for instance, the following method. A patterned photoresist layer (not shown) is formed on the hard mask layer 106. The hard mask layer 106 exposed by the patterned photoresist layer can be removed via a dry etching method to form the patterned hard mask layer 106a. The patterned photoresist layer can be further removed.

A spacer 114 is formed at two sides of the patterned hard mask layer 106a. The material of the spacer 114 is, for instance, silicon nitride. The forming method of the spacer 114 includes, for instance, forming a spacer material layer (not shown) covering the patterned hard mask layer 106a on the conductive material layer 104, and performing an etchback process on the spacer material layer via a dry etching method.

A portion of the conductive material layer 104 is removed by using the patterned hard mask layer 106a and the spacer 114 as a mask to form a conductive layer 104a and a conductive layer 104b separated from each other on the substrate 100. In particular, the conductive layer 104a can be used as a floating gate, and the conductive layer 104b can be used as a select gate. The removal method of a portion of the conductive material layer 104 is, for instance, a dry etching method. At this point, the patterned hard mask layer 106a is formed on the conductive layer 104a and the conductive layer 104b.

Figure 1C:
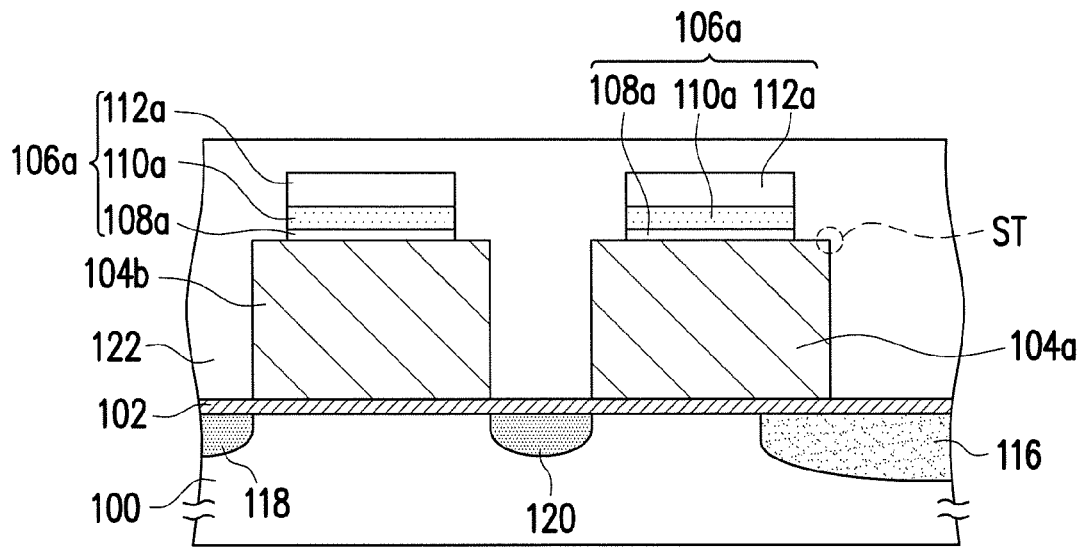

Referring to FIG. 1C, the spacer 114 can be optionally removed to expose a sharp tip ST of the conductive layer 104a. The removal method of the spacer 114 is, for instance, a wet etching method, such as performing wet etching by using hot phosphoric acid.

Here, the spacer 114 can be used to control the width of the conductive layer 104a, the width of the conductive layer 104b, and the gap width between the conductive layer 104a and the conductive layer 104b. Moreover, by using the spacer 114, the patterned hard mask layer 106a does not cover the sharp tip ST of the conductive layer 104a, and therefore the patterned hard mask layer 106a can expose the sharp tip ST of the conductive layer 104a.

A doped region 116 is formed in the substrate 100 at one side of the conductive layer 104a away from the conductive layer 104b. The doped region 116 can be used as a drain. The forming method of the doped regions 116 is, for instance, an ion implantation method. A doped region 118 is formed in the substrate 100 at one side of the conductive layer 104b away from the conductive layer 104a. The doped region 118 can be used as a source. The forming method of the doped regions 118 is, for instance, an ion implantation method.

Moreover, a doped region 120 can further be optionally formed in the substrate 100 between the conductive layer 104a and the conductive layer 104b. The forming method of the doped regions 120 is, for instance, an ion implantation method. In the present embodiment, the doped region 120 and the doped region 118 can be formed at the same time in the same ion implantation process to reduce the usage of a photomask, but the invention is not limited thereto.

When a programming operation is performed on the non-volatile memory via a hot electron injection method, the doped region 120 can be formed to facilitate the programming operation. In another embodiment, the doped region 120 can also not be formed when a programming operation is performed on the non-volatile memory via a source side injection method.

Moreover, the doped region 116, the doped region 118, and the doped region 120 do not have a specific forming order and forming method, and those having ordinary skill in the art can adjust the forming order and forming method of the doped region 116, the doped region 118, and the doped region 120 according to process design requirements.

A dielectric layer 122 is formed on the substrate 100. The dielectric layer 122 covers the conductive layer 104a, the conductive layer 104b, and the patterned hard mask layer 106a. The material of the dielectric layer 122 is, for instance, silicon oxide. The forming method of the dielectric layer 122 is, for instance, a chemical vapor deposition method. Moreover, a planarization process can further be optionally performed on the dielectric layer 122 via a chemical mechanical polishing method.

Figure 1D:
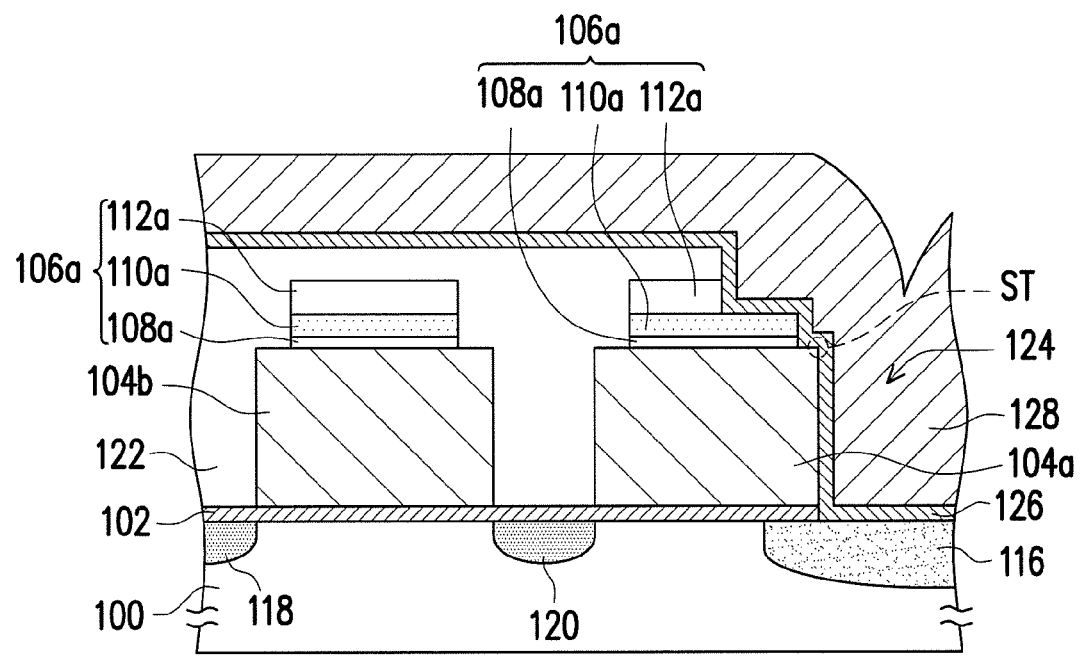

Referring to FIG. 1D, a portion of the dielectric layer 122 is removed to form an opening 124 in the dielectric layer 122. The opening 124 exposes the sharp tip ST of the conductive layer 104a, the sidewall of the conductive layer 104a adjacent to the doped region 116, and the substrate 100 located at one side of the conductive layer 104a away from the conductive layer 104b. The opening 124 can be formed via, for instance, the following method. A patterned photoresist layer (not shown) is formed on the dielectric layer 122. The dielectric layer 122 exposed by the patterned photoresist layer is removed to form the opening 124. The removal method of a portion of the dielectric layer 122 is, for instance, a dry etching method, a wet etching method, or a combination thereof. The patterned photoresist layer can be further removed.

Moreover, in the forming step of the opening 124, a portion of the patterned hard mask layer 106a located on the conductive layer 104a and adjacent to the doped region 116 can further be optionally removed, and the dielectric layer 102 located on the doped region 116 can also be optionally removed.

A dielectric layer 126 is formed on the conductive layer 104a and on the substrate 100 exposed by the opening 124. The material of the dielectric layer 126 is, for instance, silicon oxide. The forming method of the dielectric layer 126 is, for instance, a chemical vapor deposition method.

A conductive material layer 128 filling the opening 124 is formed on the dielectric layer 126. The material of the conductive material layer 128 is, for instance, doped polysilicon. The forming method of the conductive material layer 104 is, for instance, a chemical vapor deposition method.

Figure 1E:
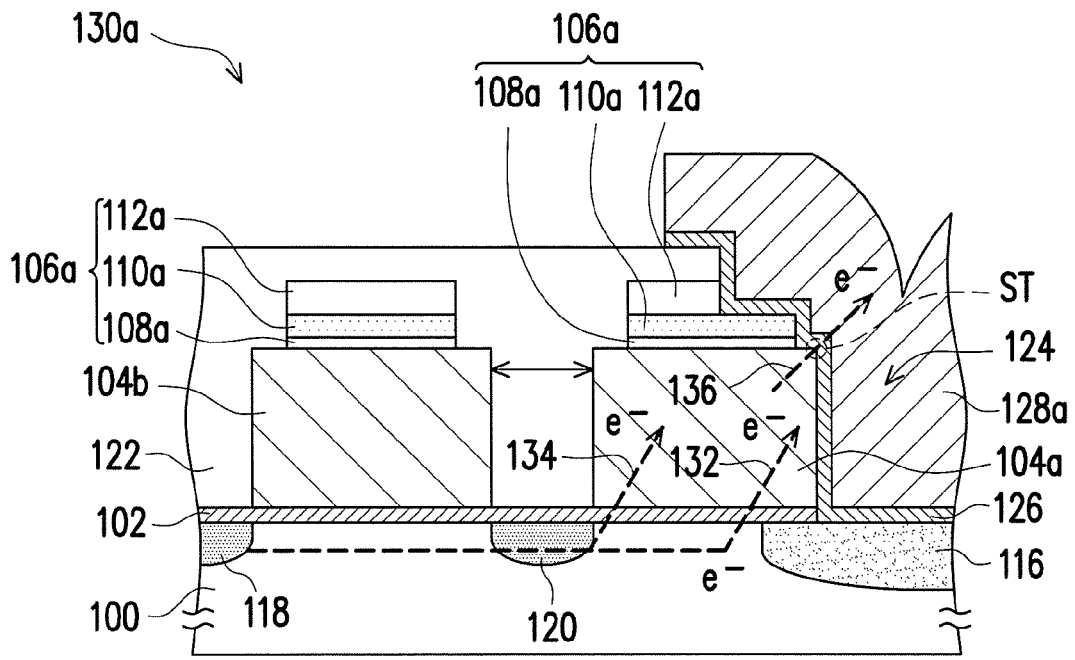
Figure 1F:
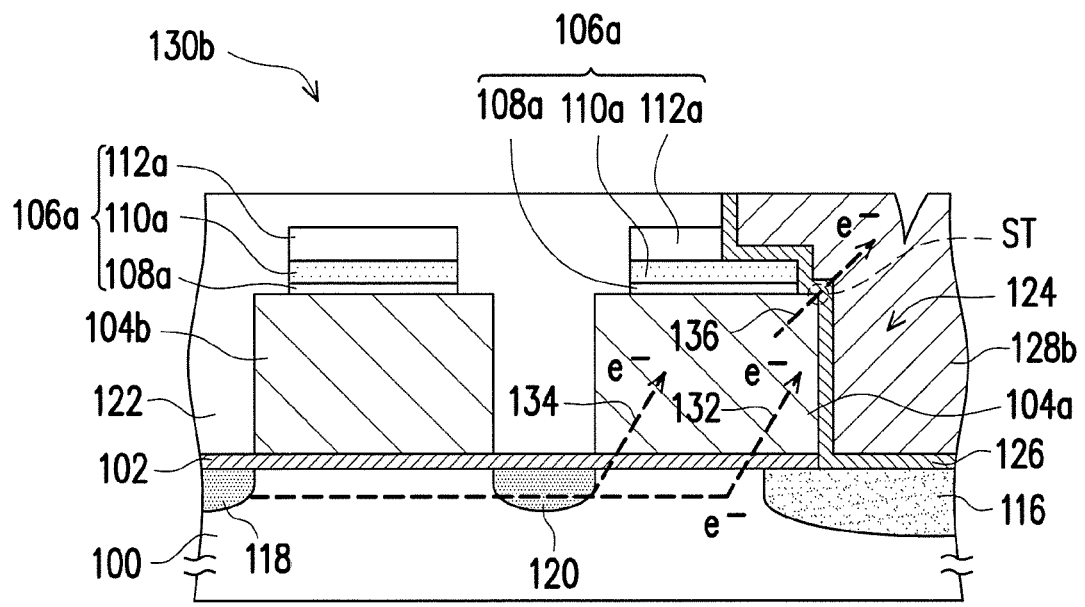
FIG. 1F is a cross-sectional view of a non-volatile memory of another embodiment of the invention.

Referring to FIG. 1E, a portion of the conductive material layer 128 is removed to form a conductive layer 128a at one side of the conductive layer 104a away from the conductive layer 104b. The conductive layer 128a is located on a portion of the conductive layer 104a and covers the sharp tip ST, and the conductive layer 128a and the conductive layer 104a can be isolated from each other via the dielectric layer 126. The conductive layer 128a can be used as an erase gate. The removal method of a portion of the conductive material layer 128 includes, for instance, performing a patterning process on the conductive material layer 128. For instance, a patterned photoresist layer (not shown) is formed on the conductive material layer 128. The conductive layer 128a can be formed by removing the conductive material layer 128 exposed by the patterned photoresist layer via a dry etching method. Moreover, the dielectric layer 126 exposed by the patterned photoresist layer can further be optionally removed. The patterned photoresist layer can be further removed.

In another embodiment, referring to FIG. 1F, the removal method of a portion of the conductive material layer 128 includes, for instance, performing a chemical mechanical polishing process on the conductive material layer 128 to form a conductive layer 128b. To ensure the conductive material layer 128 located outside the opening 124 can be completely removed, an over-polishing process can be performed on the conductive material layer 128. For instance, polishing can be performed until the dielectric layer 122 is exposed, and at this point the dielectric layer 126 above the dielectric layer 122 is removed. When a portion of the conductive material layer 128 is removed via a chemical mechanical polishing process, the conductive layer 128b can be formed without the use of a photomask.

Moreover, in the above embodiments, although the spacer 114 is removed after the conductive layers 104a and 104b are formed, the invention is not limited thereto. In another embodiment, the spacer 114 can also be removed after the opening 124 is formed, as long as the spacer 114 adjacent to one side of the doped region 116 can be removed to expose the sharp tip ST of the conductive layer 104a.

The basic structures of non-volatile memories 130a and 130b are formed via the fabricating methods of the above embodiments. In the following, the basic structures of the non-volatile memories 130a and 130b of the present embodiment are described via FIG. 1E and FIG. 1F.

Referring to FIG. 1E, the non-volatile memory 130a includes a substrate 100, a conductive layer 104a, a conductive layer 104b, a patterned hard mask layer 106a, a conductive layer 128a, a doped region 116, and a doped region 118. The conductive layer 104a and the conductive layer 104b are disposed on the substrate 100 and separated from each other. The patterned hard mask layer 106a is disposed on the conductive layer 104a and exposes a sharp tip ST of the conductive layer 104a. The patterned hard mask layer 106a can be a single layer structure or a multilayer structure. In the present embodiment, the patterned hard mask layer 106a is exemplified by including a multilayer structure of a silicon oxide layer 108a, a silicon nitride layer 110a, and a silicon oxide layer 112a. The conductive layer 128a is disposed on the substrate 100 at one side of the conductive layer 104a away from the conductive layer 104b. The conductive layer 128a is located on a portion of the conductive layer 104a and covers the sharp tip ST, and the conductive layer 128a and the conductive layer 104a are isolated from each other. The conductive layer 104a and the conductive layer 104b are, for instance, derived from the same conductive material layer, and the conductive layer 104a and the conductive layer 128a are, for instance, derived from different conductive material layers. The doped region 116 is disposed in the substrate 100 below the conductive layer 128a. The doped region 118 is disposed in the substrate 100 at one side of the conductive layer 104b away from the conductive layer 104a.

Moreover, the non-volatile memory 130a can further optionally include at least one of a dielectric layer 102, a doped region 120, a dielectric layer 122, and a dielectric layer 126. The dielectric layer 102 is disposed between the conductive layer 104a and the substrate 100 and between the conductive layer 104b and the substrate 100. The doped region 120 is disposed in the substrate 100 between the conductive layer 104a and the conductive layer 104b. The dielectric layer 122 is disposed between the conductive layer 104a and the conductive layer 104b. The dielectric layer 126 is disposed between the conductive layer 128a and the conductive layer 104a and between the conductive layer 128a and the substrate 100.

Moreover, referring to both FIG. 1E and FIG. 1F, the difference between the non-volatile memory 130b in FIG. 1F and the non-volatile memory 130a is only in that the fabricating methods of the conductive layer 128b and the conductive layer 128a are different such that the shapes of the conductive layer 128b and the conductive layer 128a are different. Moreover, the material, the forming method, and the efficacy . . . etc. of each component in the non-volatile memories 130a and 130b are described in detail above and are therefore not repeated herein.

The programming method of the non-volatile memories 130a and 130b is, for instance, a source side injection or a hot electron injection method. Specifically, in the case that the gap width between the conductive layer 104a and the conductive layer 104b is greater (such as greater than or equal to 40 nm), a programming operation can be performed on the non-volatile memory via a hot electron injection method, and at this point the doped region 120 can be formed to facilitate the programming operation. When a programming operation is performed on the non-volatile memories 130a and 130b via a hot electron injection method, an electron $e^-$ is moved along a path 132.

In another embodiment, in the case that the gap width between the conductive layer 104a and the conductive layer 104b is less (such as about 20 nm), a programming operation can be performed on the non-volatile memory via a source side injection method, and the doped region 120 can also not be formed at this point. When a programming operation is performed on the non-volatile memories 130a and 130b via a source side injection method, an electron $e^-$ is moved along a path 134.

The erasing method of the non-volatile memories 130a and 130b includes, for instance, performing erasing between the conductive layer 104a and the conductive layer 128a or between the conductive layer 104a and the conductive layer 128b via a Fowler-Nordheim (FN) tunneling method. When an erasing operation is performed on the non-volatile memories 130a and 130b via an FN tunneling method, an electron $e^-$ is moved along a path 136.

It can be known based on the above embodiments that, since the conductive layer 128a (or the conductive layer 128b) is located on a portion of the conductive layer 104a and covers the sharp tip ST, when a programming operation is performed, the conductive layer 128a (or the conductive layer 128b) and the doped region 116 can both be coupled with the conductive layer 104a, and a better coupling ratio is occurred between the conductive layer 128a (or the conductive layer 128b) and the conductive layer 104a. As a result, the voltage needed for the programming operation can be effectively reduced and the overlapping region of the doped region 116 and the conductive layer 104a can be effectively reduced. Moreover, when an erasing operation is performed, since the sharp tip ST of the conductive layer 104a can facilitate the erasing operation, the voltage needed for the erasing operation can be effectively reduced and the overlapping region of the doped region 116 and the conductive layer 104a can be effectively reduced. That is, since the voltage needed for the programming operation and the erasing operation can be effectively reduced and the overlapping region of the doped region 116 and the conductive layer 104a can be effectively reduced via the conductive layer 128a (or the conductive layer 128b), the size of memory cells can be further reduced.

The voltages used to perform the various operations on the non-volatile memories 130a and 130b in the above embodiments are examples as shown in Table 1 below. Here, in the embodiments of FIG. 1E and FIG. 1F, the doped region 118 is used as the source, the conductive layer 104b is used as the select gate, the conductive layers 128a and 128b are used as the erase gate, and the doped region 116 is used as the drain.

TABLE 1

| | | Terminal | | | |
| | | Select gate | | | |
| Operation type | Source | Selected | Unselected | Erase gate | Drain |
|---|---|---|---|---|---|
| Programming | Ground | 2 V to 3 V | Ground | 6 V to 8 V | 6 V to 8 V |
| Erasing | Ground | Ground | Ground | 10 V to 12 V | 6 V to 8 V |
| Reading | 2 V to 3 V | 2 V to 3 V | Ground | Ground | Ground |

Based on the above, the non-volatile memory and the fabricating method thereof provided in the above embodiments at least have the following characteristics. Since the conductive layer 128a (or the conductive layer 128b) is located on a portion of the conductive layer 104a and covers the sharp tip ST, the voltage needed for the programming operation and the erasing operation can be effectively reduced and the overlapping region of the doped region 116 and the conductive layer 104a can be effectively reduced. As a result, the size of memory cells can be further reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A fabricating method of a non-volatile memory, comprising:
   forming a first conductive layer and a second conductive layer separated from each other on a substrate, wherein a patterned hard mask layer is formed on the first conductive layer and on the second conductive layer, and the patterned hard mask layer exposes a sharp tip of the first conductive layer;
   forming a first doped region in the substrate at one side of the first conductive layer away from the second conductive layer;
   forming a second doped region in the substrate at one side of the second conductive layer away from the first conductive layer; and
   forming a third conductive layer at one side of the first conductive layer away from the second conductive layer, wherein the third conductive layer is located on a portion of the first conductive layer and covers the sharp tip, and the third conductive layer and the first conductive layer are isolated from each other,
   wherein the first doped region is disposed at least directly below the third conductive layer, and
   wherein a forming method of the first conductive layer and the second conductive layer comprises:
      forming a first conductive material layer on the substrate;
      forming the patterned hard mask layer on the first conductive material layer;
      forming a spacer at two sides of the patterned hard mask layer; and
      removing a portion of the first conductive material layer by using the patterned hard mask layer and the spacer as a mask.

2. The method of claim 1, further comprising forming a first dielectric layer between the first conductive layer and the substrate and between the second conductive layer and the substrate.

3. The method of claim 1, further comprising removing the spacer to expose the sharp tip of the first conductive layer.

4. The method of claim 1, wherein a forming method of the first doped region comprises an ion implantation method.

5. The method of claim 1, wherein a forming method of the second doped region comprises an ion implantation method.

6. The method of claim 1, further comprising forming a third doped region in the substrate between the first conductive layer and the second conductive layer.

7. The method of claim 1, wherein a forming method of the third conductive layer comprises:
   forming a second dielectric layer on the substrate, wherein the second dielectric layer covers the first conductive layer, the second conductive layer, and the patterned hard mask layer;
   removing a portion of the second dielectric layer to form an opening in the second dielectric layer, wherein the opening exposes the sharp tip of the first conductive layer, a sidewall of the first conductive layer adjacent to the first doped region, and the substrate located at one side of the first conductive layer away from the second conductive layer;
   forming a third dielectric layer on the first conductive layer and on the substrate exposed by the opening;
   forming a second conductive material layer filling the opening on the third dielectric layer; and
   removing a portion of the second conductive material layer.

8. The method of claim 7, further comprising performing a planarization process on the second dielectric layer before the opening is formed.

9. The method of claim 7, wherein the forming step of the opening further comprises removing a portion of the patterned hard mask layer located on the first conductive layer and adjacent to the first doped region.

10. The method of claim 7, wherein a removal method of the portion of the second conductive material layer comprises performing a patterning process or a chemical mechanical polishing process on the second conductive material layer.

* * * * *